(12) United States Patent
Weiss

(10) Patent No.: US 7,171,168 B2
(45) Date of Patent: Jan. 30, 2007

(54) RAMP SIGNAL WITH BOOST PORTION PRECEDING A TIME SLOT

(75) Inventor: Manfred Weiss, Rot-Haslach (DE)

(73) Assignee: Nokia Corporation, Espoo (FI)

( * ) Notice: Subject to any disclaimer, the term of this patent is extended or adjusted under 35 U.S.C. 154(b) by 329 days.

(21) Appl. No.: 10/936,529

(22) Filed: Sep. 9, 2004

(65) Prior Publication Data

US 2005/0266811 A1 Dec. 1, 2005

(30) Foreign Application Priority Data

Jun. 1, 2004 (GB) .................................. 0412178.6

(51) Int. Cl.
*H04B 1/02* (2006.01)
*H04B 1/04* (2006.01)

(52) U.S. Cl. ...................... 455/91; 455/125; 455/127.2

(58) Field of Classification Search .................. 455/91, 455/522, 126, 127.1, 127.2, 114.3, 127.3, 455/115.1, 125; 375/295, 296, 297
See application file for complete search history.

(56) References Cited

U.S. PATENT DOCUMENTS

| | | | |
|---|---|---|---|
| 6,380,875 B2 * | 4/2002 | Honkanen et al. ........... | 341/144 |
| 6,535,501 B1 * | 3/2003 | Bohnke ....................... | 370/345 |
| 6,625,227 B1 * | 9/2003 | Shull et al. .................. | 375/295 |
| 7,010,057 B2 * | 3/2006 | Vayrynen et al. ............ | 375/295 |
| 7,110,727 B2 * | 9/2006 | Dekker ........................ | 455/91 |
| 2002/0014983 A1 * | 2/2002 | Honkanen et al. .......... | 341/147 |
| 2003/0153285 A1 * | 8/2003 | Dekker ........................ | 455/104 |
| 2005/0054308 A1 * | 3/2005 | Vayrynen et al. ......... | 455/127.4 |
| 2005/0281353 A1 * | 12/2005 | Huang et al. ................ | 375/295 |

* cited by examiner

*Primary Examiner*—Sonny Trinh
(74) *Attorney, Agent, or Firm*—Banner & Witcoff, Ltd.

(57) ABSTRACT

A transmitter includes a power amplifier which is capable of both linear and non-linear operation, controlled by first and second control loops. A power controller includes a capacitive component, and controls the gain of the power amplifier. A ramp generation circuit provides a control signal to the power controller. It includes a ROM which stores ramp data values based on samples of a predetermined ramp shape. The ramp shape is based on a generally regular profile C, for example a $\cos^2$ or $\cos^4$ function. The ramp shape also includes a boost portion BAP, which enhances the ramp data values before the beginning of the generally regular profile C. The boost portion BAP causes the capacitor in the feedback loop of the relevant control loop to become fully charged more rapidly, which produces a corresponding increase in the output power of the power amplifier shortly after the generally regular profile C is applied. This allows the transmitter to follow the generally regular profile C of the ramp signal at an earlier time when compared with the prior art. The size of the boost portion BAP can be adjusted dependent on a detected temperature.

17 Claims, 3 Drawing Sheets

RAMP SIGNAL WITH BOOST PORTION PRECEDING A TIME SLOT

This application claims priority to GB 0412178.6 Filed Jun. 1, 2004.

FIELD OF THE INVENTION

The invention relates to a transmitter, and to a method in which power provided by a transmitter is controlled on the basis of a control signal.

BACKGROUND OF THE INVENTION

FIG. 1 depicts a communication device 1 arranged to transmit data in a series of time slots, such as a TDMA system. The communication device 1 comprises a transmitter 2 that includes a power amplifier 3, a power controller 4 arranged to control the power amplifier 3 and a control signal generator 5 that provides a control signal TXC to the power controller 4, together with a TX–RX switch 6 and antenna 7. The power amplifier 3 supplies power to the antenna 7. The antenna 7 is activated at the start of a given time slot and deactivated at the end of that time slot. Of course, TX–RX switch 6 also is connected to a receiver (not shown).

While it is desirable to maximise a portion of the time slot that can be used for data transmission, that is, the portion of the time slot during which maximum power is provided to the antenna 7, the power cannot be raised instantaneously to the maximum level without generating switching transients. In order to limit the generation of switching transients, as required, for example, by the GSM specification, the power supplied to the antenna 7 is gradually ramped up and down at the start and end of each time slot respectively. The time available for deactivating the transmitter at the end of a time slot and reactivating it at the beginning of a following timeslot may be limited. For example, it may be necessary to perform this procedure within a time interval of 33.2 μs, where a time interval of about 12 μs may be required for switching between the two power control loops in the transmitter 2, further reducing the time available for ramping the power amplifier down and up.

Recently, communication devices that are capable of transmitting data using more than one modulation scheme have become available. For example, the Nokia (RTM) 9500 communicator is arranged to send data using EDGE and using GMSK (Gaussian Minimum Shift Keying) modulation on different timeslots. FIG. 2 depicts part of an transmitter 2 suitable for use in such a communication device. FIG. 2 shows a multimode power amplifier 3 and components of the power controller 4.

When signals with a high degree of amplitude modulation are to be transmitted, such as EDGE modulated signals, the power amplifier 3 is operated in a linear mode. The power amplifier 3 is controlled using a first control loop 21, comprising a differential amplifier 8a, a feedback loop including a capacitor 9a and so on. The first control loop 21 controls the output power of the power amplifier 3 by altering an input signal fed to the power amplifier 3, by adjusting the gain of a variable gain amplifier 10.

For modulated signals with little or no amplitude modulation, such as GMSK modulated signals, the power amplifier 3 is operated in a non-linear mode in order to improve its efficiency. When the transmitter is provided in a communication device such as a mobile telephone, this increased efficiency may result in longer talktime. A second control loop 22 is provided, which includes a differential amplifier 8b and a feedback loop including a capacitor 9b. The second control loop 22 controls the power amplifier 3 by altering a voltage applied to a voltage control pin Vpctrl.

The power controller 4 can switch between the two control loops 21, 22 by means of switches 11a, 11b, 11c.

Ramping of the output power of the amplifier is controlled using a ramp signal TXC generated by the ramp control circuit 5, which follows a regular profile. However, both the control loops 21, 22 include capacitive elements, namely capacitors 9a, 9b, which prevent oscillation. These capacitors 9a, 9b need to be charged to a given level before the output of the power controller 4 can follow the profile of the ramp signal TXC. In FIG. 3, curve A shows an output power against time for an example prior transmitter 2. Curve A begins to follow the ramp signal TXC, not shown, from time $t_1$ onwards, when the output power is 10 dBm or above. This time $t_1$ occurs when the capacitor 9a, 9b in the relevant control loop is sufficiently charged. As shown in the Figure this is preceded by a steep increase in output power, which may give rise to significant switching transients.

The lack of correspondence between the control signal TXC and output power and the resulting increased switching transients arises when the transmitter 2 is initially powered up and when switching between linear and non-linear operational modes, as this involves switching from one control loop to the other.

SUMMARY OF THE INVENTION

According to a first aspect of the present invention, a transmitter comprises:
- a controllable power amplifier;
- a power controller, arranged to control the power amplifier and including a capacitive circuit; and
- a control signal generator arranged to provide a control signal to the power controller, so as to ramp up output power of the power amplifier during a predefined time slot;

wherein the control signal generator is arranged to provide the control signal comprising a boost portion preceding the beginning of the time slot and a generally regular profile portion commencing substantially at the beginning of the time slot.

In this manner, an enhanced control signal is supplied to the power controller during the boost portion. This allows capacitive components in the power controller to be charged more quickly, so that the control of the power amplifier can begin follow the control signal at an earlier time when compared with prior art arrangements.

This may reduce switching transients produced when ramping up. The invention may potentially reduce the time required to ramp up the output power to its maximum level. When used in a transmitter configured to transmit data in time slots, this may result in an increase in the useable portion of a time slot.

According to a second aspect of the present invention, a method of controlling power supplied by a transmitter, comprises:
- generating a control signal; and
- operating a power controller, which includes a capacitive element, to control the output of a power amplifier in accordance with said control signal to ramp up power output by the power amplifier at the beginning of a predefined time slot;

wherein the generated control signal comprises a boost portion preceding the beginning of the time slot and a generally regular profile portion commencing substantially at the beginning of the time slot.

BRIEF DESCRIPTION OF THE DRAWINGS

Embodiments of the invention will now be described in detail with reference to the accompanying drawings, in which.

DETAILED DESCRIPTION OF THE PREFERRED EMBODIMENT

Figure 1:
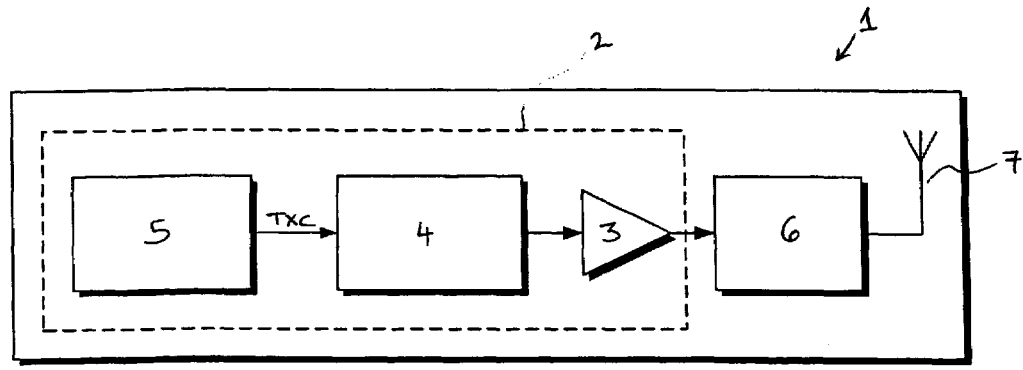
FIG. 1 is a block diagram of a data transmission system.
Figure 2:
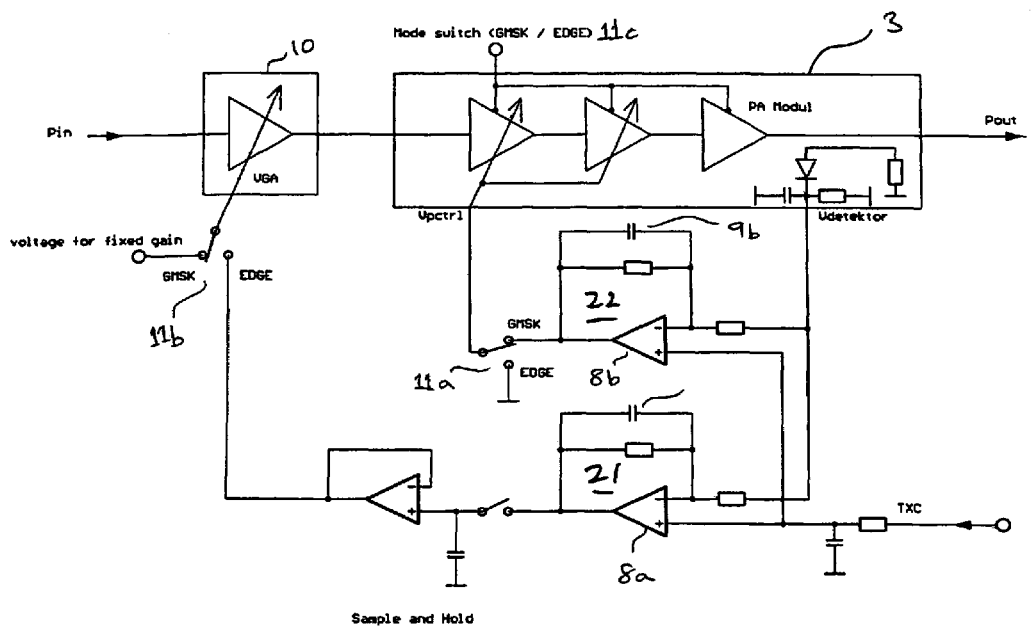
FIG. 2 depicts part of a known transmitter.

A transmitter 2 comprises a power amplifier 3 and a power controller 4, as shown in FIGS. 1 and 2. The power amplifier 3 is capable of both linear and non-linear operation and is controlled by first and second control loops as described above in relation to the prior art.

Figure 4:
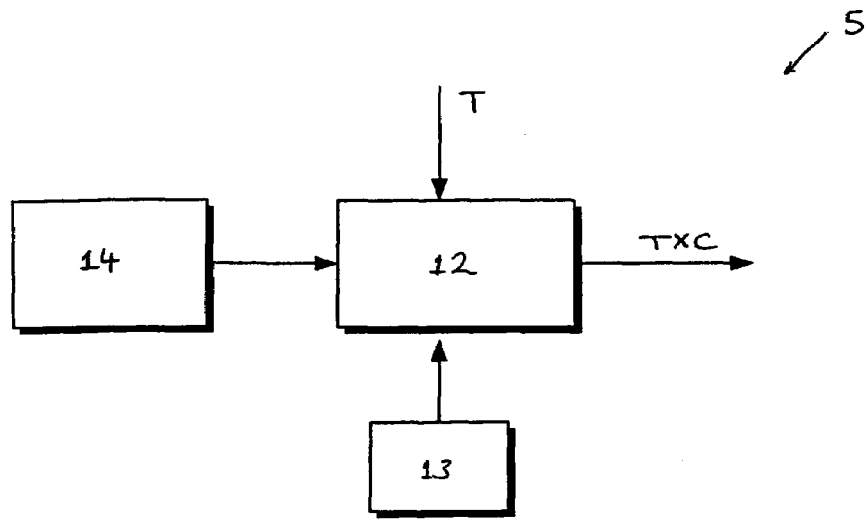
FIG. 4 is a block diagram of a ramp generation circuit provided in a first embodiment of the invention.

FIG. 4 shows the ramp generation circuit 5 of the transmitter 2 of the first embodiment in more detail. The ramp generation circuit 5 comprises a signal generator 12 with an associated clock 13 and a memory facility, such as ROM 14. The ROM 14 stores ramp data values based on samples of a predetermined ramp shape. If required, the signal generator 12 may include interpolating means for generating extra ramp values from the ramp data values stored in the ROM 14.

Figure 5:
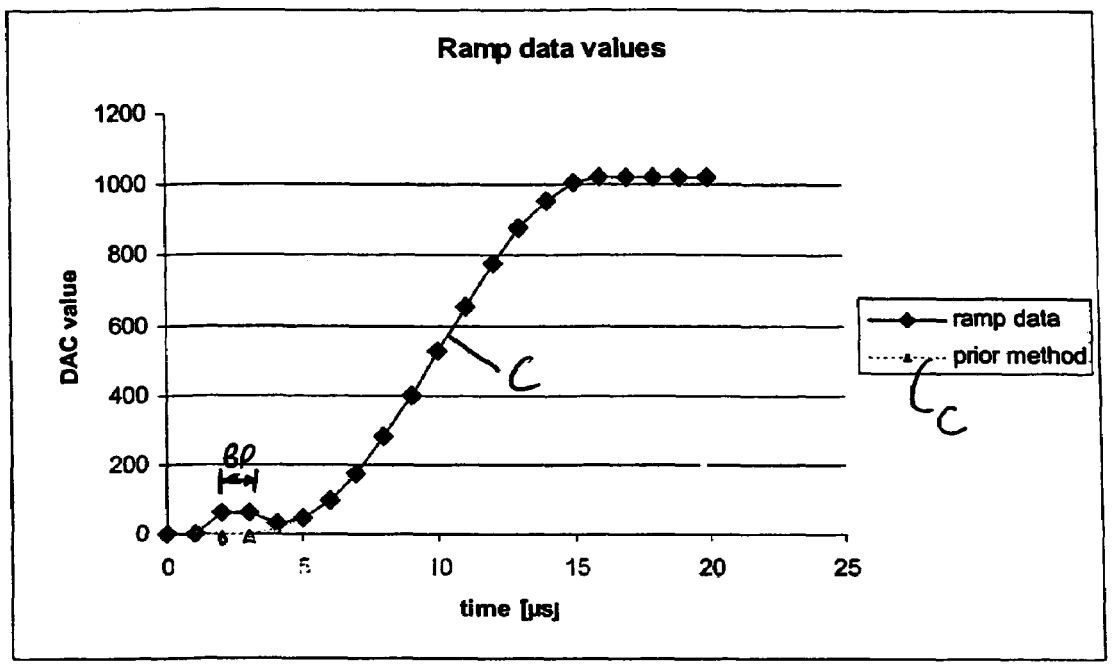
FIG. 5 depicts an example set of ramp data values for a prior art arrangement and for an arrangement according to the invention.

An example set of ramp data values is represented in FIG. 5. The tamp shape is based on a generally regular profile C (also labelled 'prior method'). The generally regular profile C may be based on a trigonometric formula such as a $\cos^2$ or $\cos^4$ function. Here, the generally regular portion has a value of zero at 3 μs, and rises above zero at 4 μs. These times correspond to fourth and fifth samples respectively. The ramp shape is preceded by a boost portion BAP, which enhances the ramp data values before the beginning of the generally regular profile C. The boost portion BAP here comprises two adjacent data values of 60, compared to a maximum value of 1023. The boost portion values are present at 2 and 3 μs, i.e. the third and fourth samples respectively. The generally regular profile C begins at the sample immediately following the second sample of the boost period BAP, i.e. the fifth sample. In this example, the fifth sample, the sample immediately following the second sample of the boost period, has a value of 31.

The boost portion BAP causes the capacitor 9a, 9b in the feedback loop of the relevant control loop to become charged more rapidly than in the prior art. This produces a corresponding increase in the output power of the power amplifier 3 when the generally regular profile C is subsequently applied, when compared with prior art arrangements.

Figure 3:
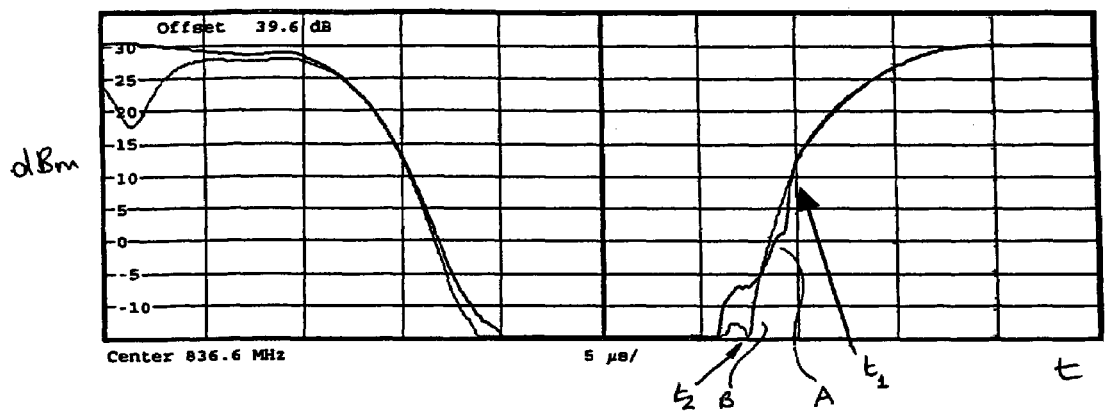
FIG. 3 is a graph of output power provided by the power amplifier against time for a prior art arrangement and for an arrangement according to the invention.

As a result, the transmitter 2 is able to follow the ramp signal TXC at an earlier time when compared with the prior art. Referring again to FIG. 3, curve B represents the output power of the transmitter 2 against time for a transmitter 2 according to the present invention. Curve B begins to follow the generally regular ramp profile C at time $t_2$, where $t_2$ occurs before the equivalent time $t_1$ achieved by the prior art arrangement.

Preferably, as described above, the boost period BAP is followed by a decrease in the tamp. In this way, the boost period BAP brings the output of the differential amplifier in the control loop to the point where the power amplifier 3 starts to deliver output power. From this point, the normal $\cos^2$ curve commences. This results is a greater switching spectrum improvement than is found when the amplitude of the control signal at the end of the boost portion is selected to coincide with the amplitude of the control signal at the beginning of the generally regular profile portion.

The profile of the boost portion BAP is not critical, although its size, that is, its amplitude integrated with respect to time (i.e. the area under the graph), is important. For example, a boost portion with a length of 2 μs with an amplitude equal to 4% of the maximum ramp level is equivalent to boost portions with lengths of 1 μs and 8 μs and amplitudes equal to 8% or 1% of the maximum ramp level respectively.

Figure 6:
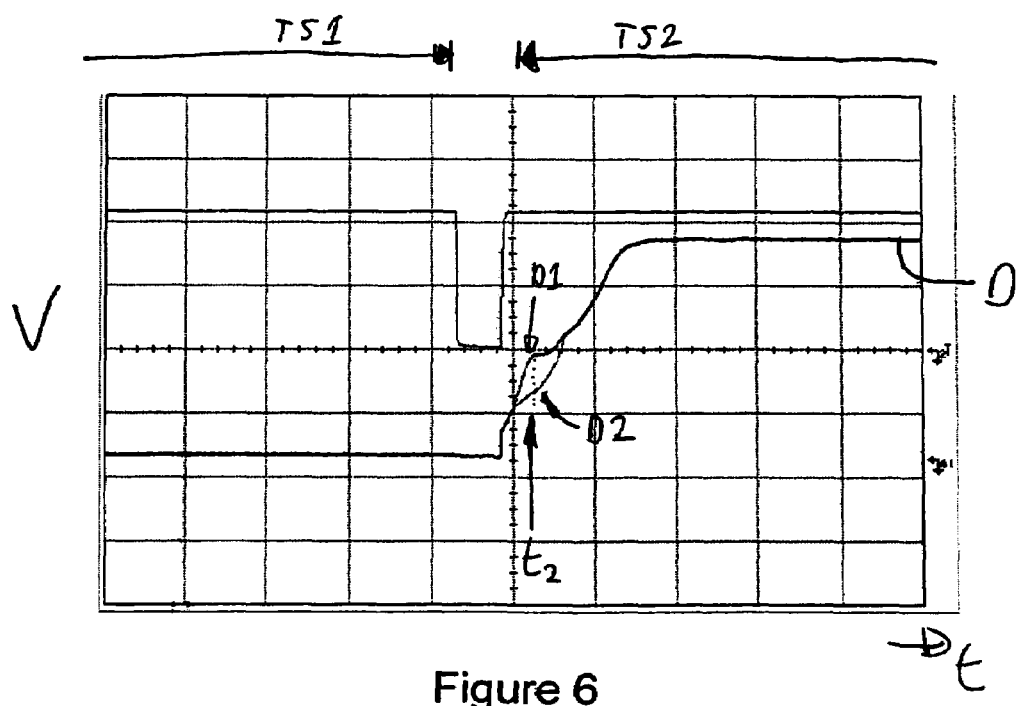
FIG. 6 is a graph depicting a control voltage supplied to a power amplifier for a prior art arrangement and for an arrangement according to the invention.

FIG. 6 shows a control voltage applied to the voltage control pin Vpctrl of the power amplifier 3 during two successive time slots. In this example, EDGE modulated signals are transmitted during a first time slot TS1. The power amplifier 3 is operated in linear mode during time slot TS1 and controlled using the first control loop 21 and the variable gain amplifier 10, so no voltage is applied to the pin Vpctrl. The output of the power amplifier 3 is ramped down at the end of time slot TS1. The power controller 4 then switches to the second control loop 22 before the second time slot TS2 begins. At the start of time slot TS2, in which GMSK modulated signals are to be transmitted, the second control loop 22 is switched on. The boost portion BAP results in a higher output power during an initial portion of the ramp, indicated by line portion $D_1$. The output power of a prior art arrangement during a corresponding time interval is shown by line portion $D_2$. The control loop in the present transmitter 2 starts to follow the ramp signal at a time indicated by $t_2$ in the Figure. This point $t_2$ is notable because of the abrupt levelling in the gradient of the curve in FIG. 6, whereas the prior art arrangement only begins to follow the ramp signal much later, as shown by the later point at which $D_1$ and $D_2$ coincide.

If required, the tamp generation circuit 5 may be arranged to receive a signal T relating to a temperature measurement and to adjust the boost portion accordingly. In this example, a plurality of sets of tamp data values are stored in the ROM 14, and the ramp signal TXC is generated using a set of ramp data values selected according to the detected temperature. At a low temperature, an increased boost portion is required in order to provide the same effect as a lower boost portion at a higher temperature.

In alternative embodiments, the ramp data values stored in ROM 14 may be based on the generally regular profile C, with data values corresponding to the boost portion stored or generated separately. The ramp signal TXC may then be generated by adding boost portion data values to the stored ramp data values, or alternatively by using boost portion data values during a time interval that expires at time $t_2$ and using stored ramp data values thereafter. In such embodiments, the boost portion data values may be generated, or alternatively selected from a plurality of sets of boost portion data values, according to a temperature measurement signal T.

The above embodiments may be implemented in Digital Signal Processing (DSP) software configured to control the transmitter 2.

While the embodiments have been described above in relation to a communication device, such as a mobile telephone, a transmitter according to the present invention may be used in any data transmitting device, portable or fixed, including base station transmitters. It is particularly suitable for mixed mode data transmission devices.

The invention is not limited to transmitters comprising the control loops shown in FIG. 2. The invention may be used to reduce ramp up times in any control loops including capacitive elements. As noted above, control loops will generally include capacitors in order to prevent oscillation or to minimise noise.

The invention is also not restricted to arrangements comprising multimode power amplifiers. If required, separate power amplifiers controlled by separate power loops may be provided.

What is claimed is:

1. A transmitter comprising:
   a controllable power amplifier;
   a power controller, arranged to control the power amplifier and including a capacitive circuit; and
   a control signal generator arranged to provide a control signal to the power controller, so as to ramp up output power of the power amplifier during a predefined time slot; wherein the control signal generator is arranged to provide the control signal comprising:
   a boost portion preceding the beginning of the time slot, and
   a generally regular profile portion commencing substantially at the beginning of the time slot.

2. A transmitter according to claim 1, in which the end of the boost portion is timed to coincide at least approximately with the beginning of the generally regular profile portion.

3. A transmitter according to claim 1, wherein the profile of the control signal is stored in memory.

4. A transmitter according to claim 3, wherein a plurality of control signal profiles are stored in memory.

5. A transmitter according to claim 1, in which the amplitude of the control signal during the boost portion is dependent on a detected temperature.

6. A transmitter according to claim 5, wherein a plurality of control signal profiles are stored in memory, and wherein one of the control signal profiles is selected dependent on a detected temperature.

7. A transmitter according to claim 1, wherein the control signal generator is arranged to add a predetermined signal to a signal having a generally regular profile, thereby to provide the control signal.

8. A transmitter according to claim 1, wherein the amplitude of the signal during the generally regular profile portion is defined by a trigonometric function.

9. A transmitter according to claim 8, wherein the trigonometric function is a $\cos^2$ or a $\cos^4$ function.

10. A transmitter according to claim 1, wherein the power controller includes a first power control loop for controlling the supplied power during a first time slot and a second power control loop for controlling the supplied power during a second time slot that immediately follows the first time slot in the series, the power amplifier being arranged to operate in a non-linear mode during the first time slot and to operate in a linear mode during the second time slot.

11. A transmitter according to claim 1, wherein the data is transmitted in a first time slot according to a first modulation scheme and the data is transmitted in a second time slot, immediately following the first time slot, according to a second modulation scheme.

12. A transmitter according to claim 11, wherein the first modulation scheme is GMSK.

13. A transmitter according to claim 11, wherein the first modulation scheme is EDGE.

14. A communication device comprising a transmitter as claimed in claim 1.

15. A radiotelephone comprising a transmitter as claimed in claim 1.

16. A transmitter comprising:
    a controllable power amplifier;
    a power controller, arranged to control the power amplifier and including a capacitive circuit; and
    a control signal generator arranged to provide a control signal to the power controller, so as to ramp up output power of the power amplifier during a predefined time slot;
    wherein the control signal generator is arranged to provide the control signal comprising:
    a boost portion preceding the beginning of the time slot, the amplitude of the boost portion being dependent on a detected temperature, and
    a generally regular profile portion commencing substantially at the beginning of the time slot.

17. A method of controlling power supplied by a transmitter, comprising:
    generating a control signal; and
    operating a power controller, which includes a capacitive element, to control the output of a power amplifier in accordance with said control signal to ramp up power output by the power amplifier at the beginning of a predefined time slot;
    wherein the generated control signal comprises a boost portion preceding the beginning of the time slot and a generally regular profile portion commencing substantially at the beginning of the time slot.

* * * * *